United States Patent
Lasbouygues et al.

(10) Patent No.: US 7,876,141 B2
(45) Date of Patent: Jan. 25, 2011

(54) SYNCHRONIZATION PULSE GENERATOR WITH FORCED OUTPUT

(75) Inventors: Benoît Lasbouygues, Fontaine (FR); Sylvain Clerc, Grenoble (FR); Alain Artieri, Saint Martin D'heres (FR); Thomas Zounes, Encinitas, CA (US); Françoise Jacquet, Froges (FR)

(73) Assignees: STMicroelectronics Inc., Coppell, TX (US); STMicroelectronics S.A., Montrouge (FR)

( * ) Notice: Subject to any disclaimer, the term of this patent is extended or adjusted under 35 U.S.C. 154(b) by 40 days.

(21) Appl. No.: 12/251,376

(22) Filed: Oct. 14, 2008

(65) Prior Publication Data
US 2009/0146720 A1    Jun. 11, 2009

(30) Foreign Application Priority Data
Oct. 16, 2007    (FR)    ................... 07 58346

(51) Int. Cl.
    *H03K 5/01*    (2006.01)
(52) U.S. Cl. .................. 327/165; 327/164; 327/166; 327/167; 326/37; 326/38; 326/46
(58) Field of Classification Search ................. 327/164, 327/165, 166, 170; 326/37, 38, 46
See application file for complete search history.

(56) References Cited

U.S. PATENT DOCUMENTS

| | | | |
|---|---|---|---|
| 5,619,157 | A | 4/1997 | Kumata et al. |
| 7,129,762 | B1 | 10/2006 | Vadi |
| 7,253,661 | B1 * | 8/2007 | Tuan et al. ................. 326/46 |
| 2004/0196067 | A1 | 10/2004 | Hossain et al. |
| 2007/0075762 | A1 | 4/2007 | Kim |

OTHER PUBLICATIONS

Kozu, S. et al. "A 100mHz, 0.4 W RISC processor with 200 MHz multiply adder, using pulse-register technique". Solid-State Circuits Conference, 1996. Digest of Technical Papers, pp. 140-141, 432.
French Search Report dated Jun. 19, 2008 from French Patent Application No. 07/58346.

* cited by examiner

*Primary Examiner*—Lincoln Donovan
*Assistant Examiner*—John W Poos
(74) *Attorney, Agent, or Firm*—Lisa K. Jorgenson; James H. Morris; Wolf, Greenfield & Sacks, P.C.

(57) ABSTRACT

A generator of synchronization pulses intended for at least two registers, including a first input intended to receive a clock signal and at least one output intended to deliver the pulses on the clock input of said registers, and at least one second input intended to receive a signal for forcing the output, independently from the clock signal, to make said registers transparent.

12 Claims, 9 Drawing Sheets

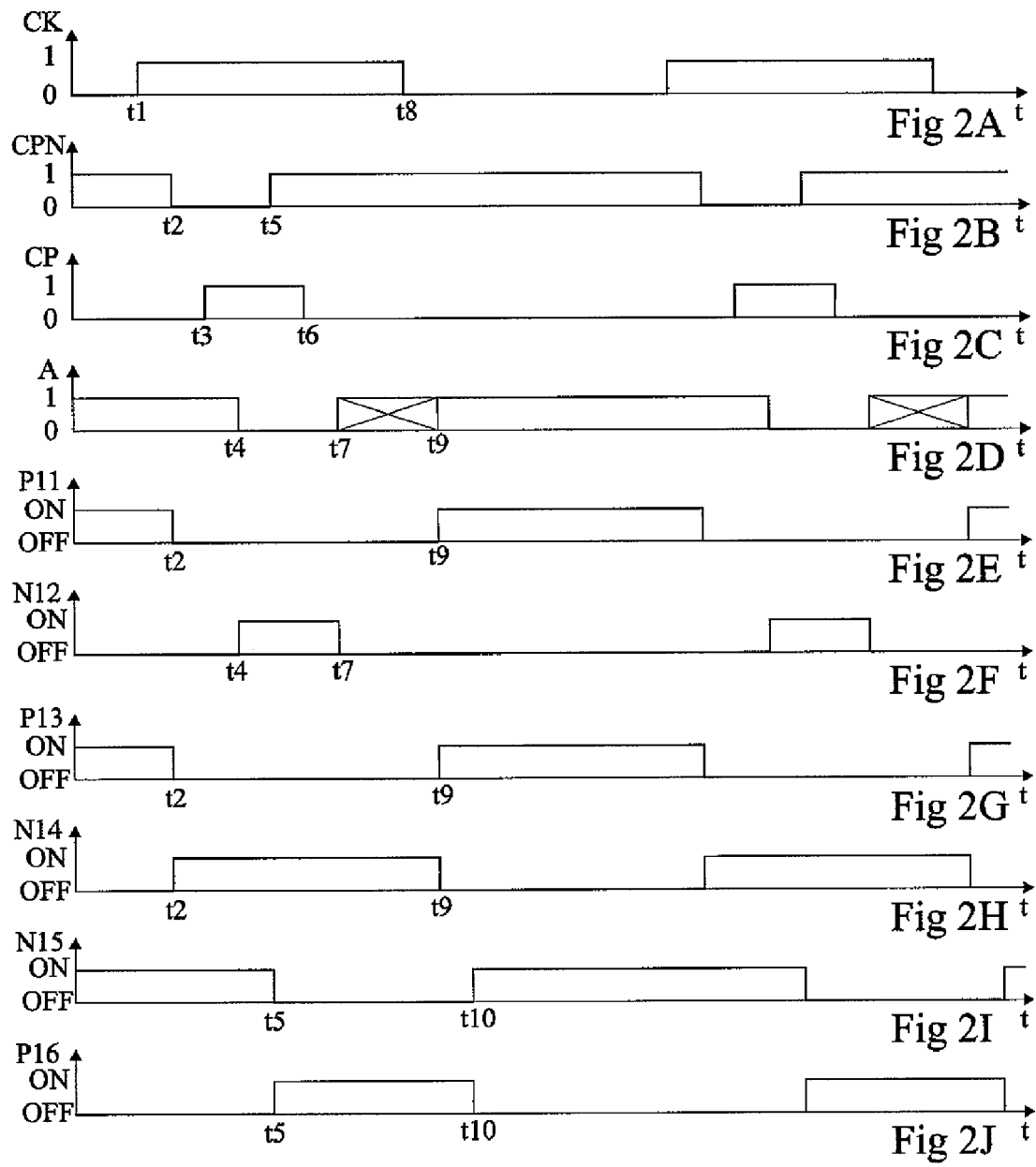
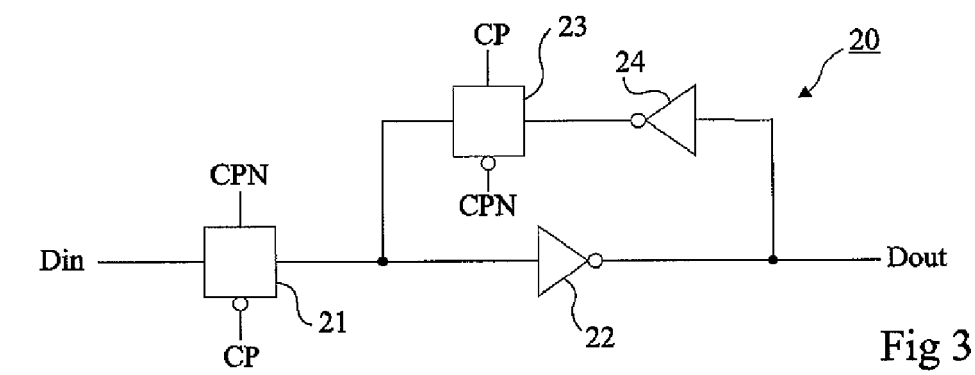

SYNCHRONIZATION PULSE GENERATOR WITH FORCED OUTPUT

CROSS REFERENCE TO RELATED APPLICATIONS

This application claims the priority benefit of French patent application number 07/58346, filed on Oct. 16, 2007, entitled "Pulse Generator," which is hereby incorporated by reference to the maximum extent allowable by law.

BACKGROUND OF THE INVENTION

1. Field of the Invention

The present invention generally relates to synchronous integrated circuits. More specifically, the present invention relates to integrated circuits synchronized on signals provided by pulse generators.

2. Discussion of the Related Art

Integrated circuits comprising data transmission lines can be synchronized in several ways. For example, flip-flops comprising two registers synchronized on a clock signal and its complement may be used. A single register synchronized on a signal provided by a pulse generator may also be used. The present application relates to this last type of integrated circuits. An example of a circuit of this type is described in IEEE ISSCC96, 0-7803-3136-2, FA 8.6, entitled "A 100 MHz, 0.4 W RISC Processor with 200 MHz Multiply-Adder, using Pulse-Register Technique" by Shinichi Kozu et al.

It would be desirable to have a pulse generator enabling making registers synchronized on the signal provided by the generator transparent, to decrease the integrated circuit power consumption.

It would also be desirable to have a pulse generator enabling blocking the output states of the registers synchronized on the signal provided by the generator at a given time.

Further, a disadvantage of known circuits exploiting the technique of registers synchronized on pulses is that the associated pulse generator suffers from a lack of reliability. In particular, it is likely to generate parasitic pulses.

SUMMARY OF THE INVENTION

An aspect of the present invention aims at a synchronization pulse generator enabling making registers synchronized on the signal provided by the generator transparent when a functional test of an integrated circuit is performed.

An embodiment of this first aspect aims at a pulse generator enabling blocking the output states of the registers synchronized on the signal provided by the generator at a given time.

Another aspect of the present invention aims at avoiding the generation of parasitic pulses.

An embodiment further aims at decreasing the power consumption of an integrated circuit comprising elements synchronized by pulses.

An embodiment of the present invention provides a generator of synchronization pulses intended for at least two registers, comprising a first input intended to receive a clock signal and at least one output intended to deliver the pulses on the clock input of said registers, comprising at least one second input intended to receive a signal for forcing the output, independently from the clock signal, to make said registers transparent.

According to an embodiment, the pulse generator further comprises a third input intended to receive a signal for forcing the output, independently from the clock signal, to block the output states of said registers.

According to an embodiment, the pulse generator comprises: a first P-type MOS transistor and a second N-type MOS transistor, these transistors being series-connected between two terminals of application of a D.C. supply voltage, the gate of the first transistor being connected to the first input of the pulse generator and the gate of the second transistor being connected to the output of the pulse generator; a two-input NAND gate having one input connected to the first input of the pulse generator and having its other input connected to the junction point of the first and second transistors; a third P-type MOS transistor having its gate connected to the second input of the pulse generator, the third transistor being connected between the first one of the terminals of application of the D.C. voltage and the supply terminal of the NAND gate; a fourth N-type MOS transistor having its gate connected to the second input of the pulse generator, the fourth transistor being connected between the output of the NAND gate and the second terminal of application of the D.C. voltage; and an inverter connected between the output of the NAND gate and the output of the pulse generator.

According to an embodiment, the NAND gate comprises: a fifth P-type MOS transistor, a sixth N-type MOS transistor, and a seventh N-type MOS transistor, series-connected between the third transistor and the second terminal of application of the D.C. voltage, the gates of the fifth and sixth transistors being connected to the first input of the pulse generator, the gate of the seventh transistor being connected to the junction point of the first and second transistors, the junction point of the fifth and sixth transistors being connected to the input of the inverter; and an eight P-type MOS transistor, connected in parallel on the fifth transistor, having its gate connected to the junction point of the first and second transistors.

According to an embodiment, the pulse generator further comprises: a ninth P-type MOS transistor, connected between the first terminal of application of the D.C. voltage and the first transistor, having its gate connected to the third input of the pulse generator; and a tenth N-type MOS transistor, connected between the junction point of the first and second transistors and the second terminal of application of the D.C. voltage, having its gate connected to the third input of the pulse generator.

According to an embodiment, the pulse generator further comprises: an eleventh P-type MOS transistor, connected in parallel on the sixth transistor, having its gate connected to the junction point of the first and second transistors; and a twelfth and a thirteenth N-type MOS transistors, series-connected between the junction point of the first and second transistors and the second terminal of application of the D.C. voltage, the gate of the twelfth transistor being connected to the junction point of the sixth and seventh transistors, the gate of the thirteenth transistor being connected to the first input of the pulse generator.

An embodiment provides a synchronous integrated circuit comprising: at least a first set of registers having respective clock inputs connected to the output of a first pulse generator, the registers of the first register set capable of receiving a forcing of their output to a state; and at least a second set of registers having respective clock inputs connected to the output of a second pulse generator such as described hereabove.

According to an embodiment, the first pulse generator comprises an input intended to receive a signal for forcing its output to block the output states of the registers of the first set of registers.

According to an embodiment, at least some of the registers of the first set of registers receive pulses originating from two different pulse generators according to the operating mode, between a normal operating mode and an operating mode in which the outputs of said registers are to be forced.

An embodiment provides a method for carrying out a functional test of an integrated synchronization circuit comprising: at least a first set of registers having respective clock inputs connected to the output of a first pulse generator, the registers of the first set of registers being likely to receive a forcing of their outputs; and at least a second set of registers having respective clock inputs connected to the output of a second pulse generator such as described hereabove, the outputs of the registers of the first set of registers being forced to a state and the registers of the second set of registers being made transparent.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 2A to 2J are timing diagrams illustrating the operation of the pulse generator of FIGS. 1A and 1B;

FIG. 3 is a simplified diagram of a register that can be synchronized on pulses;

DETAILED DESCRIPTION

Figure 1A:
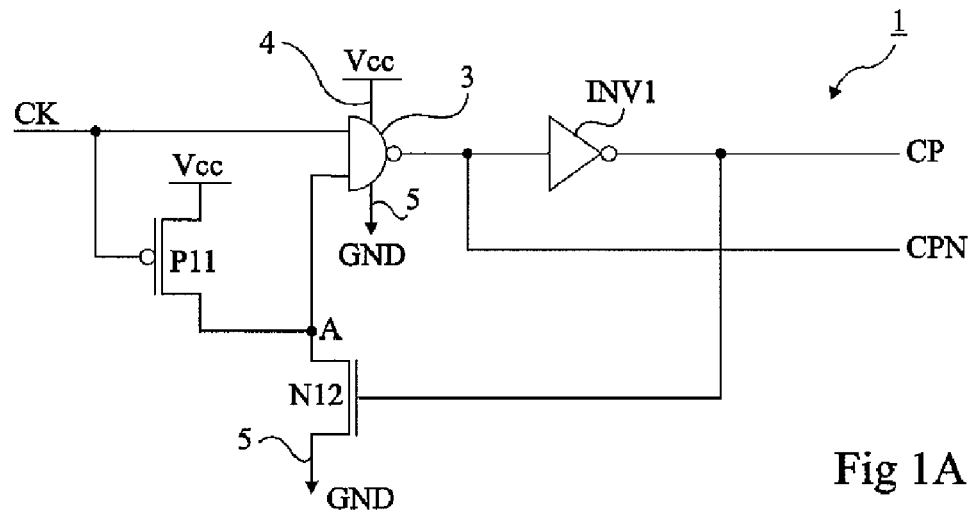
FIG. 1A is a simplified diagram of a known pulse generator.

The same elements have been designated with the same reference numerals in the different drawings. Further, for clarity, only those steps and elements which are useful to the understanding of the present invention have been shown and will be described.

Figure 1B:
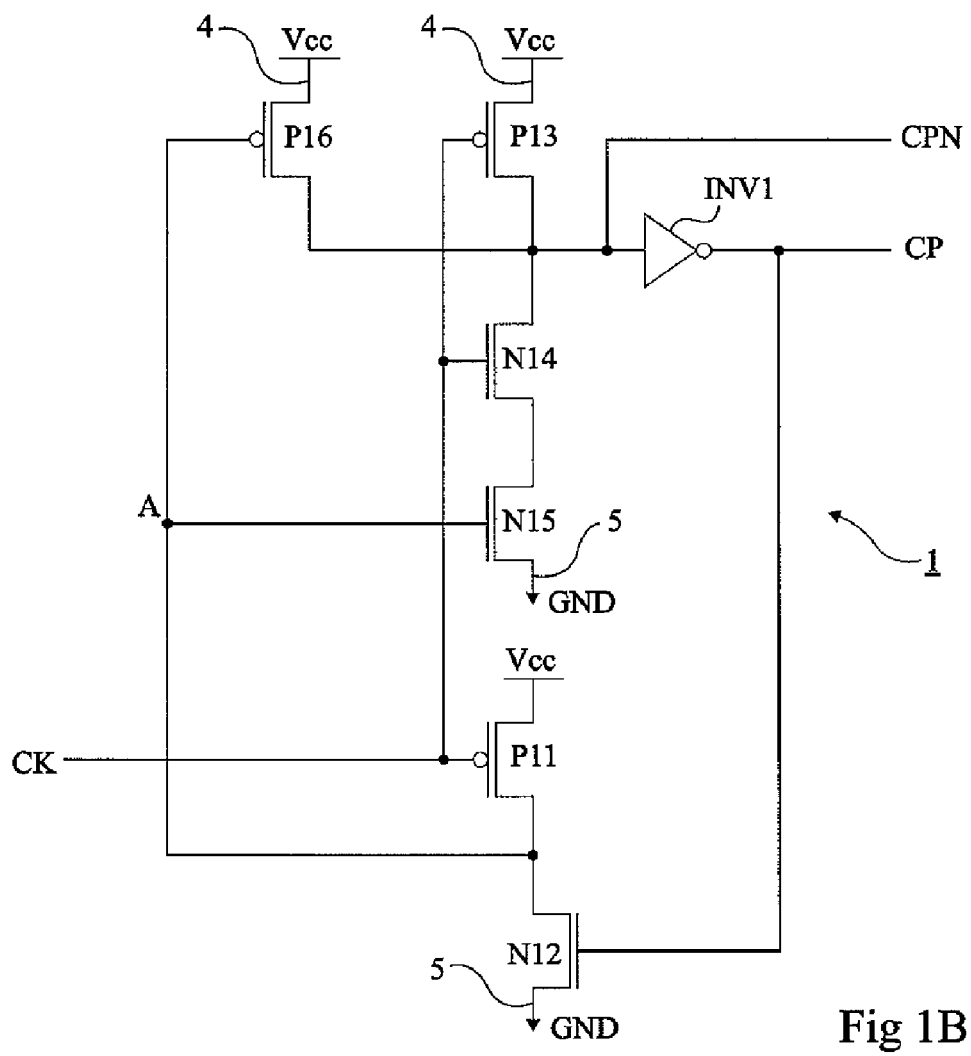
FIG. 1B is a more detailed electric diagram of the pulse generator of FIG. 1A.

FIGS. 1A and 1B respectively show, in a simplified diagram and in a more detailed electric diagram, a conventional pulse generator 1.

Pulse generator 1 comprises an input CK intended to receive a clock signal and two outputs CP and CPN, output CPN being the inverse of output CP. Generator 1 comprises a P-type MOS transistor P11 and an N-type MOS transistor N12, series-connected between two terminals 4 and 5 of application of a D.C. supply voltage Vcc, terminal 5 being, for example, connected to ground GND. The gate of transistor P11 is connected to clock input CK and the gate of transistor N12 is connected to output CP. The junction point between transistors P11 and N12 will be called A hereafter. The circuit comprises a two-input NAND gate 3, the first input being connected to input CK and the second input being connected to node A. The output of gate 3 is connected to output CPN of the pulse generator and to the input of an inverter INV1 having its output connected to output CP. Inverter INV1 is supplied with voltage Vcc.

In FIG. 1B, NAND gate 3 of FIG. 1A is shown in detail. A P-type MOS transistor P13 and two N-type MOS transistor N14 and N15 are series-connected between terminals 4 and 5. The gates of transistors P13 and N14 are connected to input CK and the gate of transistor N15 is connected to node A. The junction point of transistor P13 and N14 is connected to output CPN. A P-type MOS transistor P16 is connected in parallel with transistor P13, its gate being connected to node A.

FIGS. 2A to 2J are timing diagrams illustrating the operation of the pulse generator of FIGS. 1A and 1B. These drawings respectively shown examples of shapes of the signals at input CK, at outputs CPN, CP, at node A, and of the states of transistors P11 to P16. It is here assumed that the switching times of transistors P11 to P16 are equal and that they are equal to the switching times of inverter INV1. Further, the voltage drops in the transistors are neglected when they are on.

It is started from a state where input CK is low. Thus, transistors P11 and P13 are on and transistor N14 is off. Via transistor P13, voltage Vcc is present on output CPN and output CP is low. Via transistor P11, voltage Vcc is present on the gates of transistors N15 and P16. Transistor P16 is off and transistor N15 is on. Output CP being low, transistor N12 is off.

At a time t1, input CK switches to the high state. At a time t2 subsequent to time t1, transistors P11 and P13 turn off and transistor N14 is turned on. Since transistor N12 is also blocked, node A is set to a high-impedance state. Output CPN is connected to ground GND via on transistors N14 and N15. Output CP thus switches, at a time t3 subsequent to time t2, to the high state. Transistor N12 is thus turned on (time t4), which grounds node A. It is assumed that, between times t2 and t4, node A remains in a state (high) which is sufficient to maintain transistor P16 off and transistor N15 on. This assumes that the leakage currents of the gate capacitances of transistors P16 and N15 are compatible (sufficiently low) with duration t4-t2 and that the leakage of transistor N12 is not too strong. At time t4, node A is in the low state, which turns off transistor N15 and turns on transistor P16 (time t5). Output CPN is in the high state (Vcc) via transistor P16, and output GP switches to the low state at a time t6. Transistor N12 turns off (time t7), which sets node A back to a high-impedance state.

A falling edge of signal CK (time t8) causes the turning-on of transistor P13 (time t9), which enables maintaining output CPN in the high state and output CP in the low state. The turning-on of transistor P11 switches node A back to the high state (time t9). The switching of node A to the high state turns on transistor N15 and turns off transistor P16 at a time t10. It is here assumed that, between times t7 and t9, node A remains in the low state. This assumes that the gate capacitances of transistors N15 and P16 are sufficient for node A not to charge to a non-zero voltage via the leakages through transistor P11 (which leakages must be low). In the opposite case, the switching to the high state of the voltage at node A would cause the forming of at least another pulse on output CP during the clock cycle. Node A may also remain at an intermediary voltage resulting in short-circuit currents between transistors N14, N15, and P16. This state can last for as long as the clock is maintained in the high state.

At the next clock cycle, the process starts again and a new pulse is obtained on outputs CP and CPN.

The pulses generated by the pulse generator of FIGS. 1A and 1B have the same frequency as that of the clock signal provided on input CK. Their widths depend on the structure of transistors N12 and P16 and on the load connected at the pulse generator output (number of registers synchronized by the pulse generator). By modifying the gate lengths (L) and widths (W) of transistors N12 and P16, the pulse width is thus modified.

Figure 4:
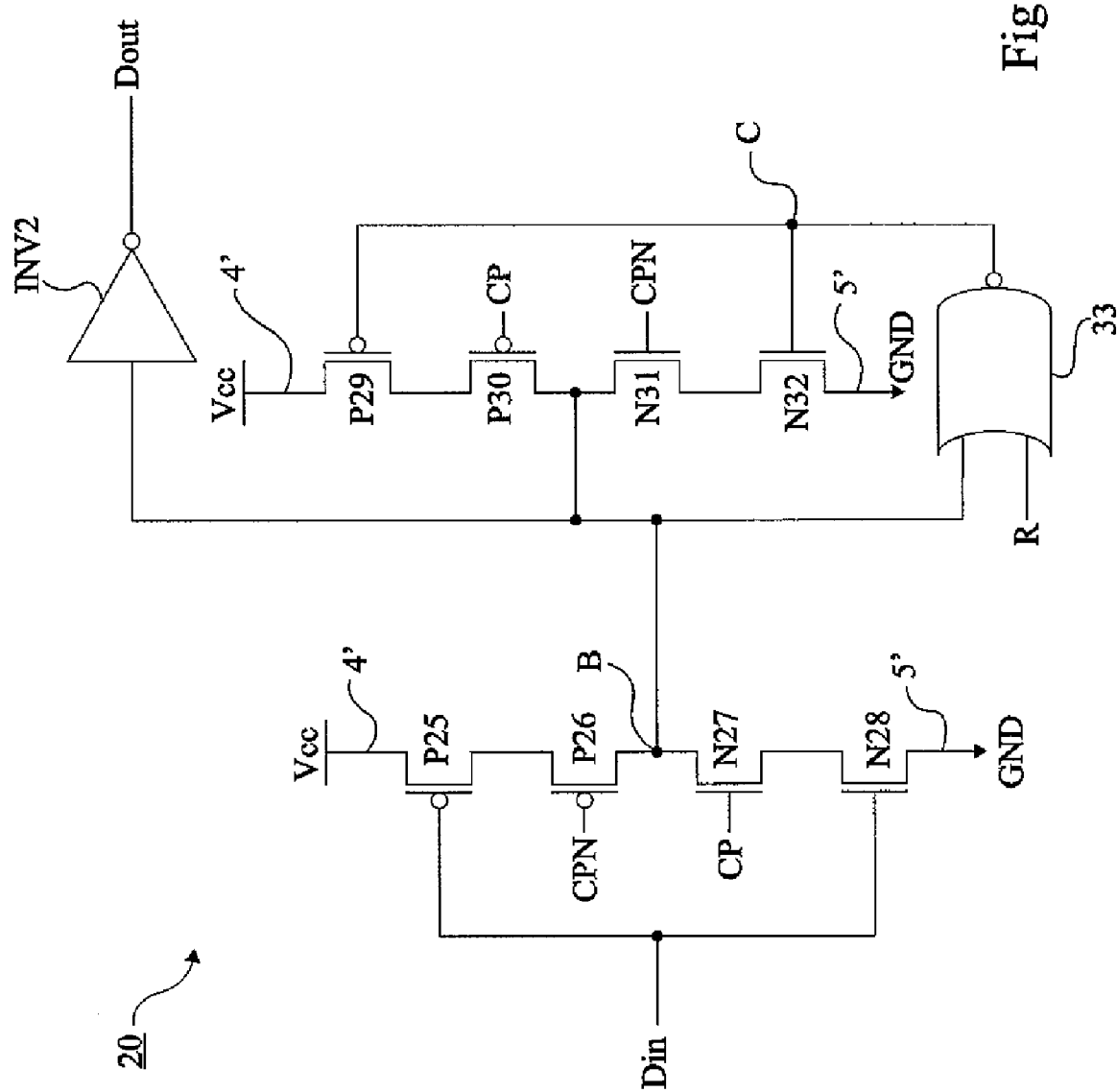
FIG. 4 is a more detailed electric diagram of the register of FIG. 3.

FIGS. 3, 4, 5A, and 5B illustrate three types of registers that can be synchronized by one or two pulse clocks, these registers being formed of looped-back controlled gates. FIGS. 3 and 4 relate to a simple register 20, and FIGS. 5A and 5B relate to registers 40 and 40' comprising elements enabling forcing one of the register outputs to a desired state (called "scan registers").

In FIG. 3, a data signal input Din (to be synchronized) of register 20 is connected to a controlled switch 21 which is on when the signal on output CP of the associated pulse register is in the high state. The output of switch 21 is connected, by an inverter 22, to an output Dout of the register providing the synchronized data signal. Output Dout is connected to another controlled switch 23 by an inverter 24, switch 23 being on when output CP is in the low state. The output of switch 23 is connected to the output of switch 21. Inverters 22 and 24 are supplied with voltage Vcc.

When the signal on terminal CP is high, the data arriving on input Din are transferred to output Dout of the register by being inverted. When the signal on terminal CP switches to the low state, switch 21 turns off while switch 23 turns on, which enables storing the datum on output Dout.

FIG. 4 is a detailed electric circuit of a register similar to that of FIG. 3. Four P-type MOS transistors P25 and P26 and N-type MOS transistors N27 and N28 are series-connected between two terminals 4' and 5' of application of D.C. supply voltage Vcc, terminal 5' being for example connected to ground GND. The gates of transistors P25 and N28 are connected to input Din, the gate of transistor P26 is connected to terminal CPN, and the gate of transistor N27 is connected to terminal CP. Junction point B of transistors P26 and N27 is connected, by an inverter INV2 (corresponding to inverter 22 of FIG. 3), to output Dout. Node B is also connected to a first input of a NOR gate 33, supplied with voltage Vcc, having a second input R intended to receive a reset signal. Four MOS transistors, P-type transistors P29 and P30 and N-type transistors N31 and N32, are series-connected between terminals 4' and 5'. The gates of transistors P29 and N32 are connected to output C of gate 33, the gate of transistor P30 is connected to terminal CP, and the gate of transistor N31 is connected to terminal CPN. The junction point of transistors P30 and N31 is connected to node B.

When the signal provided on input R is in the low state, gate 33 behaves as an inverter of the signal present at node B. When the signal provided on input R is in the high state, the output of gate 33 is forced to the low state. This forces node C to a low state, node B to a high state, and output Dout to a low state when terminal CP is in a low state. This for example enables resetting the register output. As a variation, this reset function may not be present, gate 33 being then replaced with an inverter between nodes B and C.

Circuit testability requirements have led to including in said circuits registers provided with test mode forcing means. In such a mode, the registers are scan chained, the output of a register of the scan chain being connected to the test mode input (TI) of the next register.

Figure 5A:
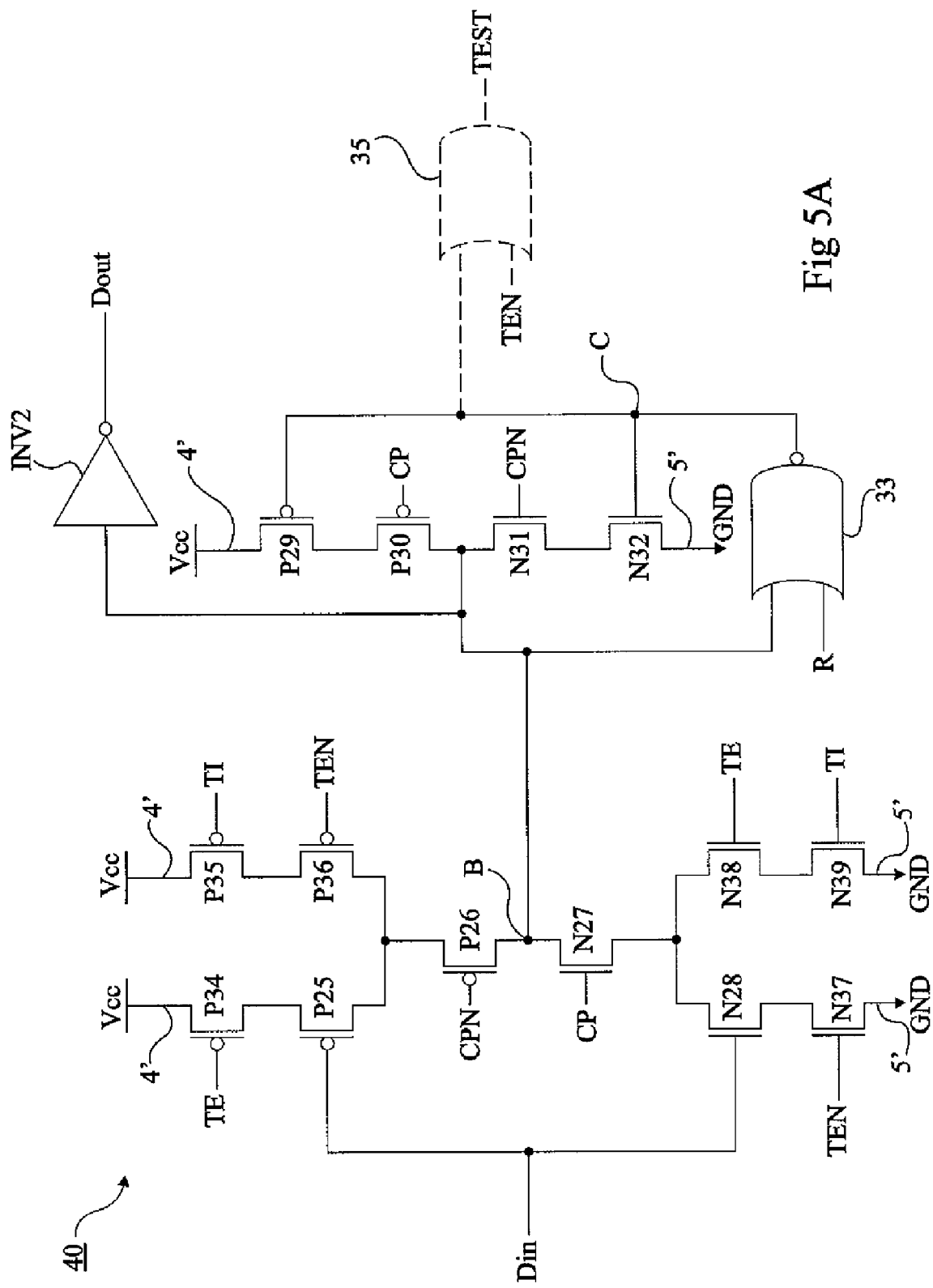
FIG. 5A is a detailed electric diagram of a register that can be synchronized on pulses, with an output that can be forced.

FIG. 5A is an electric circuit of a register 40 using the elements of register 20 of FIG. 4 and further comprising elements for forcing output Dout of the register, independently from the signal on input Din. A P-type MOS transistor P34 is connected between terminal 4' and transistor P25, and two P-type MOS transistors P35 and P36 are series-connected between terminal 4' and the junction point between transistors P25 and P26. Further, an N-type MOS transistor N37 is connected between transistor N28 and terminal 5', and two N-type MOS transistors N38 and N39 are series-connected between the junction point between transistors N27 and N28 and terminal 5'. The gates of transistors P34 and N38 are connected to a terminal of application of a signal TE. The gates of transistors P35 and N39 are connected to a terminal of application of a signal TI. The gates of transistors P36 and N37 are connected to a terminal of application of a signal TEN complementary to signal TE. Signal TE is a signal for selecting the register operating mode. When signal TE is low, the register operates normally, that is, it transfers in synchronized fashion the data arriving onto input Din. When signal TE is in the high state, the register is in functional test mode, that is, in forced mode. It then ignores the data arriving onto input Din and transfers signal TI. By studying the register output according to the different states of input TI, a functional test of the circuit containing the register is performed to check the proper operation thereof. A test output TEST (optional) may be provided to dissociate the output of the register scan chain in test mode from the output in normal operation. Output TEST may be the output of an OR gate 35 (shown in dotted lines), supplied with voltage Vcc, receiving signal TEN and the signal at node C as inputs. In the same way as in the case of the register of FIG. 4, the reset function (gate 33) is optional in this circuit.

Figure 5B:
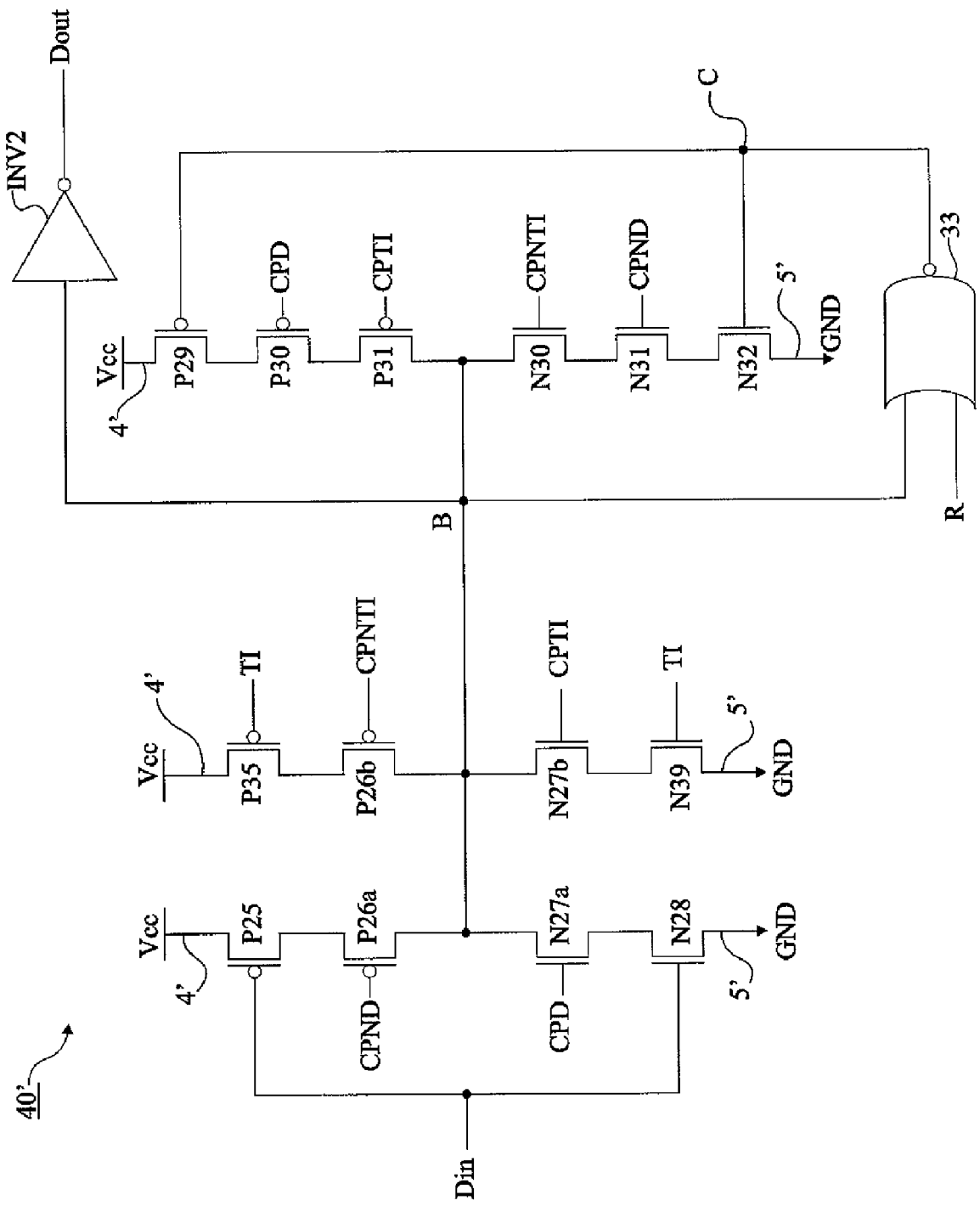
FIG. 5B is a detailed electric diagram of another register that can be synchronized on pulses, with an output that can be forced.

FIG. 5B is an electric diagram of another pulse register 40' comprising elements for forcing its output. This register uses two synchronization signals, CPD and CPTI, provided by two separate pulse generators, and their complementaries, respectively CPND and CPNTI. The first pulse register generates pulses (CPD/CPND) in the normal operation mode and the second generator generates pulses (CPTI/CPNTI) in the test mode. This circuit has a general structure similar to that of FIG. 5A and it especially comprises gates 33 and INV2, transistors P25 and N28 having their gates connected to data input Din, transistors P35 and N39 having their gates connected to test input TI, and transistors P29 and N32 having their gates connected to node C (output of gate 33). It further comprises:

a P-type MOS transistor P26a series-connected with transistor P25 between terminal 4' and node B, having its gate connected to terminal CPND;

an N-type MOS transistor N27a, series-connected with transistor N28 between node B and terminal 5', having its gate connected to terminal CPD;

a P-type MOS transistor P26b, series-connected with transistor P38 between terminal 4' and node B, having its gate connected to terminal CPNTI;

an N-type MOS transistor N27b, series-connected with transistor N29 between node B and terminal 5', having its gate connected to terminal CPTI;

a P-type MOS transistor P31, series-connected with transistor P30 between terminal 4' and node B, having its gate connected to terminal CPTI;

an N-type MOS transistor N30, series-connected with transistor N31 between node B and terminal 5', having its gate connected to terminal CPNTI.

The gate of transistor P30 is connected to terminal CPD and the gate of transistor N31 is connected to terminal CPND.

In normal operation, pulses are generated by the first pulse generator (CPD/CPND) to synchronize signal Din at the register output. In test mode, the second pulse generator (CPTI/CPNTI) generates pulses to synchronize signal TI on the register output. As compared with the register of FIG. 5A, the register of FIG. 5B has the advantage of performing the test mode forcing with one less transistor stage at the register input, which enables increasing the switching speed of node B, and thus of the register. Further, the decrease in the number of transistors between the supply terminals allows for a supply with a lower voltage or a larger deviation at node B. As compared with the circuit of FIG. 5A, two pulse generators instead of one are to be provided.

Figure 6A:
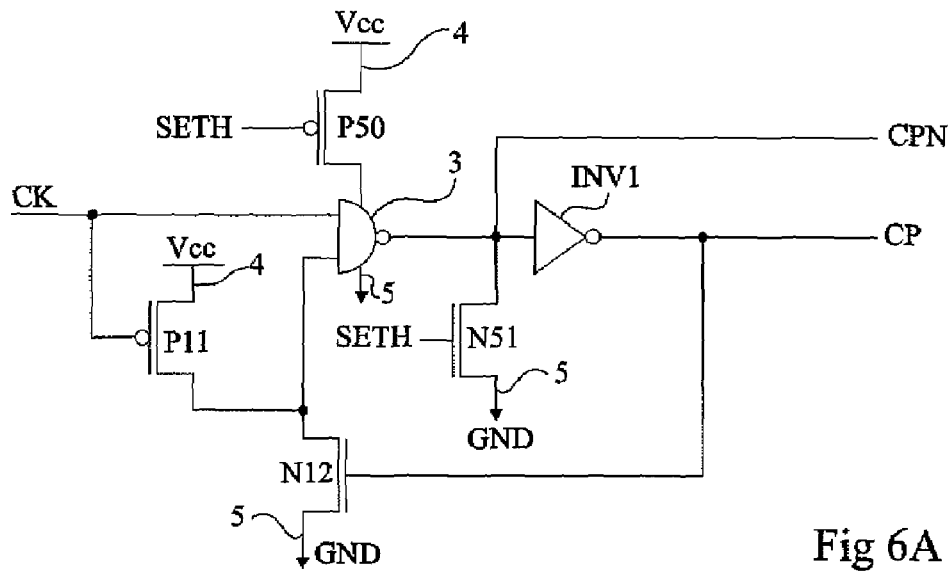
FIG. 6A is a simplified diagram of an embodiment of a pulse generator according to a first aspect.
Figure 6B:
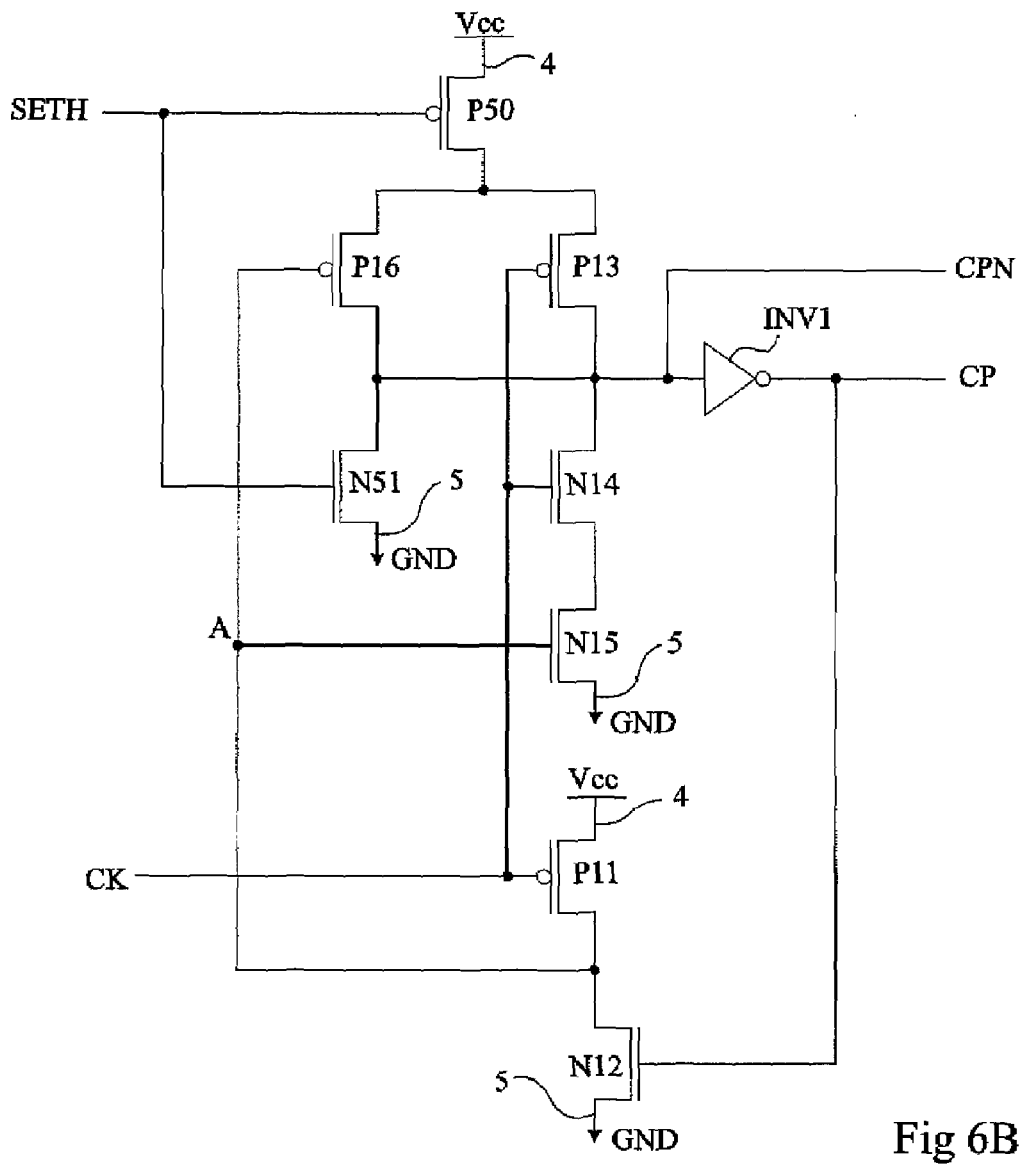
FIG. 6B is a more detailed electric diagram of the pulse generator of FIG. 6A.

FIGS. 6A and 6B illustrate an embodiment of a pulse generator according to the first aspect. FIG. 6A shows elements of FIG. 1A and FIG. 6B shows elements of FIG. 1B. As compared with these drawings, the pulse generator further comprises a second input SETH connected to the gate of two MOS transistors, a P-type transistor P50, and an N-type transistor N51. Transistor P50 is connected between terminal 4 (Vcc) and the supply terminal of NAND gate 3 (FIG. 6A) or between terminal 4 and transistors P16 and P13 (FIG. 6B). Transistor N51 is connected between output CPN and terminal 5 (GND).

When the signal on input SETH is low, transistor P50 is on and transistor N51 is off. The pulse generator then operates in the same way as described in relation with FIG. 2A to 2J. When the signal on input SETH is high, transistor P50 is off and it inhibits transistors P16 and P13. Transistor N51 (on) forces output CPN to the low state, and thus output CP to the high state. The registers which have their clock inputs connected to output CP are then made "transparent". "Transparent" here means a register having its output following its input, independently from any synchronization and thus with no memory effect. Indeed, when output CP is in the high state, switch 21 (FIG. 3) of the register is on and switch 23 is off. The data transit from input Din to output Dout while being inverted, but without any memory storage.

Figure 7:
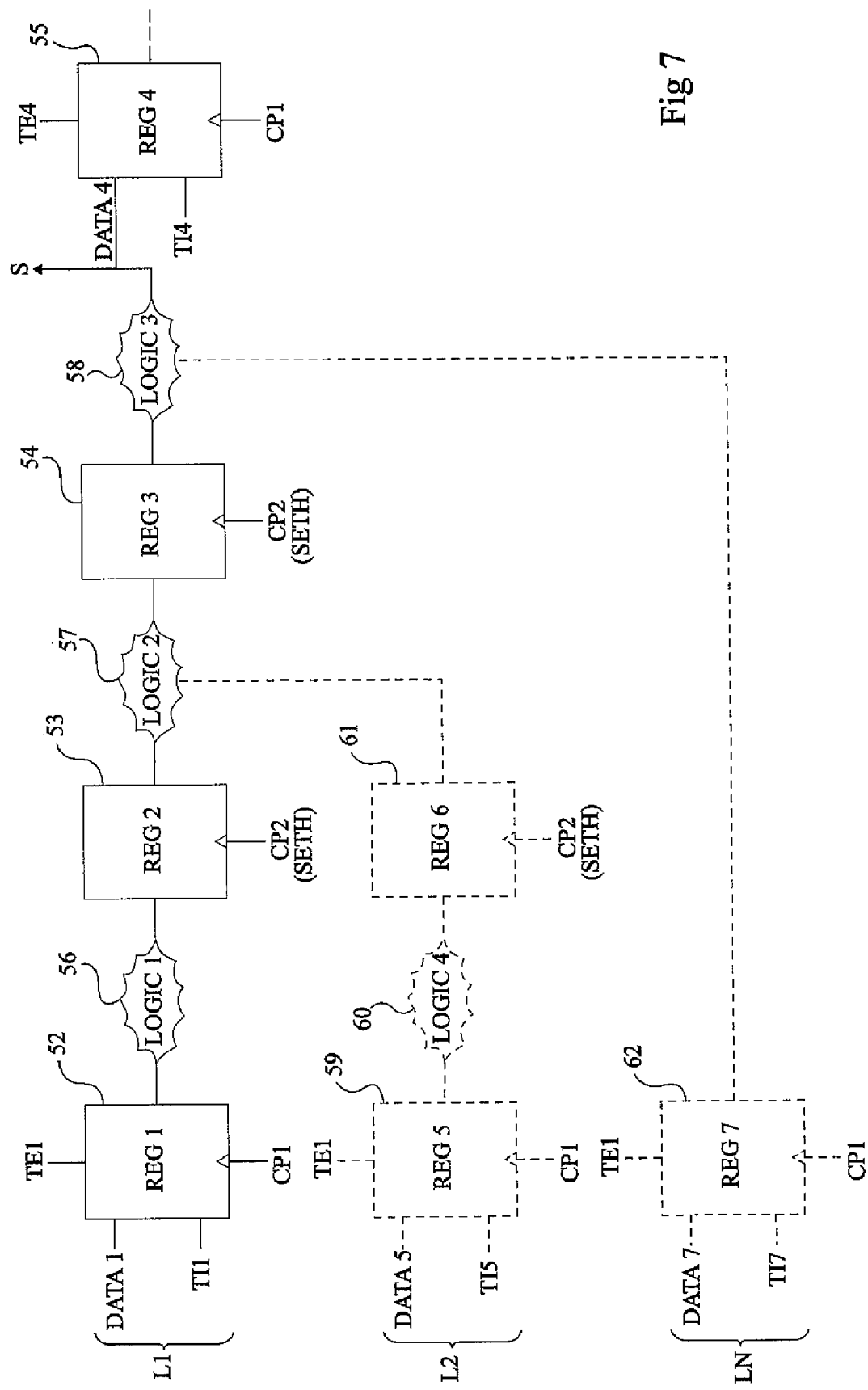
FIGS. 7 and 8 illustrate an example of architecture of synchronization circuits.
Figure 8:
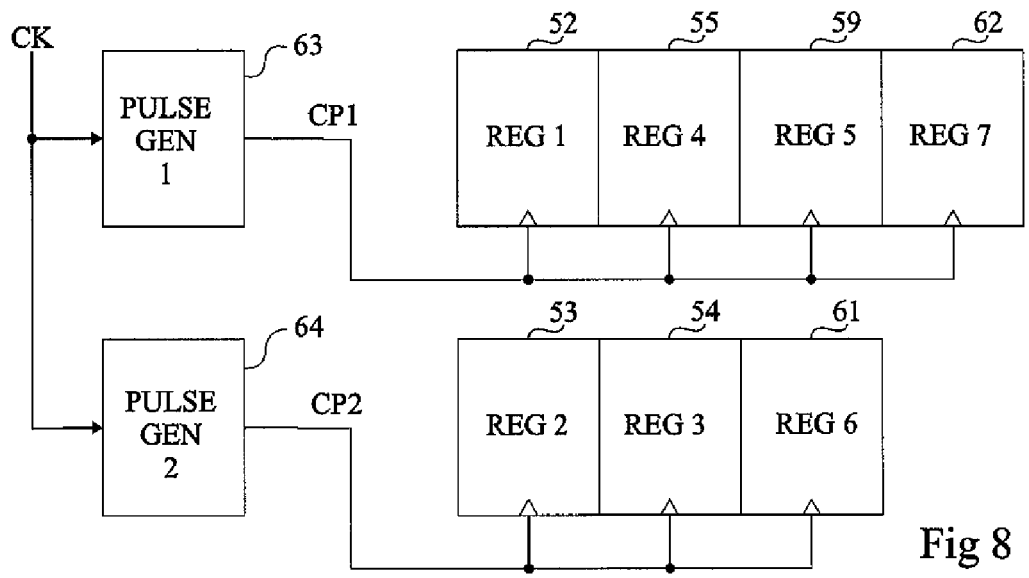

Making the registers transparent may be useful, for example, in a functional testing of an integrated circuit. FIGS. 7 and 8 illustrate an example of architecture of a circuit exploiting this aspect.

FIG. 7 very schematically shows an example of data transmission lines of a circuit.

FIG. 8 illustrates an example of association of the registers of FIG. 7 with two different pulse generators.

In FIG. 7, an integrated circuit comprising a first data transmission line L1 which comprises four registers 52 to 55 (REG1, REG2, REG3, and REG4) and three logic blocks 56 to 58 (LOGIC1, LOGIC2, and LOGIC3) is considered. Logic blocks 56 to 58 are formed of purely combinational elements, each block being interposed between the output of a register and the data input of the next register. A test output S is provided at the output of logic block 58.

Registers 52 and 55 are, for example, of the type of that in FIG. 5A, that is, their outputs may be forced by their selection inputs TE1 and their test inputs TI1 and TI4. They are synchronized on output CP1 of a first pulse generator, where this pulse generator may be any generator (for example, that of FIGS. 1A and 1B or 6A and 6B).

Registers 53 and 54 are, for example, of the type of that in FIG. 4 and comprise no elements for forcing their outputs.

They are synchronized on output CP2 of a second pulse generator comprising an input for forcing output CP2 to the high state (for example, the generator of FIGS. 6A and 6B). Both pulse generators receive a same clock signal on their CK inputs.

In normal operation, selection signal TE1 is set so that the data provided on respective data inputs DATA1 and DATA4 of registers 52 and 55 are synchronized at the output of these registers. Registers 53 and 54 are, in this case, synchronized on pulses originating from the second pulse generator.

In functional test mode, the outputs of registers 52 and 55 are forced to a state by selection signal TE1 and test signals TI1 and TI4. Since a fixed state is sent over line L1 rather than a data flow, no synchronization is required on registers 53 and 54. These registers are then made transparent by forcing output CP2 of the second pulse generator to the high state, by the sending on its input SETH of a signal in the high state. Power is thus spared by avoiding unnecessary switchings within registers 53 and 54.

As illustrated in dotted lines in FIG. 7, the integrated circuit may also include other lines, for example, a line L2 and a line LN. Line L2 comprises a register 59 (REG5) of the same type as registers 52 and 55, synchronized on output CP1 of the first pulse generator. At the output of register 59 is connected a logic block 60 (LOGIC4) having its output provided on the data input of a register 61 (REG6) of the same type as registers 53 and 54, synchronized on output CP2 of the second pulse generator. The output of register 61 is used by logic block 57 of first line L1. Line LN comprises a register 62 (REG7) of the same type as registers 52, 55, and 59. The output of register 62 is used by logic block 58 of first line L1.

In test mode, the outputs of registers 59 and 62 are forced to fixed states on test inputs TI5 and TI7 by means of selection input TE1, and the state of output S is studied in the different configurations. Like registers 53 and 54, register 61 is made transparent in this operating mode.

FIG. 8 illustrates the vectorization of the different registers of FIG. 7. The first pulse generator (PULSE GEN 1, 63) has its output CP1 connected to the clock inputs of registers 52, 55, 59, and 62. The second pulse generator (PULSE GEN 2, 64) has its output CP2 connected to the clock inputs of registers 53, 55, and 61. The number of registers sharing the same pulse generator is selected according to the output power of the pulse generator to optimize the consumption. It should be noted that registers 52, 55, 59, and 62 may be of the register type of FIG. 5B, these registers being connected to adapted pulse generators.

The vectorization enables connecting to the output of a same pulse generator a group of registers of same type. All the registers in this group may for example be made transparent at the same time by the forcing to the high state of the output of a pulse generator that they share. The registers of this type may be registers comprising no elements enabling functional testing of the integrated circuit (FIGS. 3 and 4). This enables decreasing the integrated circuit cost and sparing surface area. Further, this is obtained by only lightly modifying (addition of two transistors and of one input) the pulse generator structure.

Figure 9:
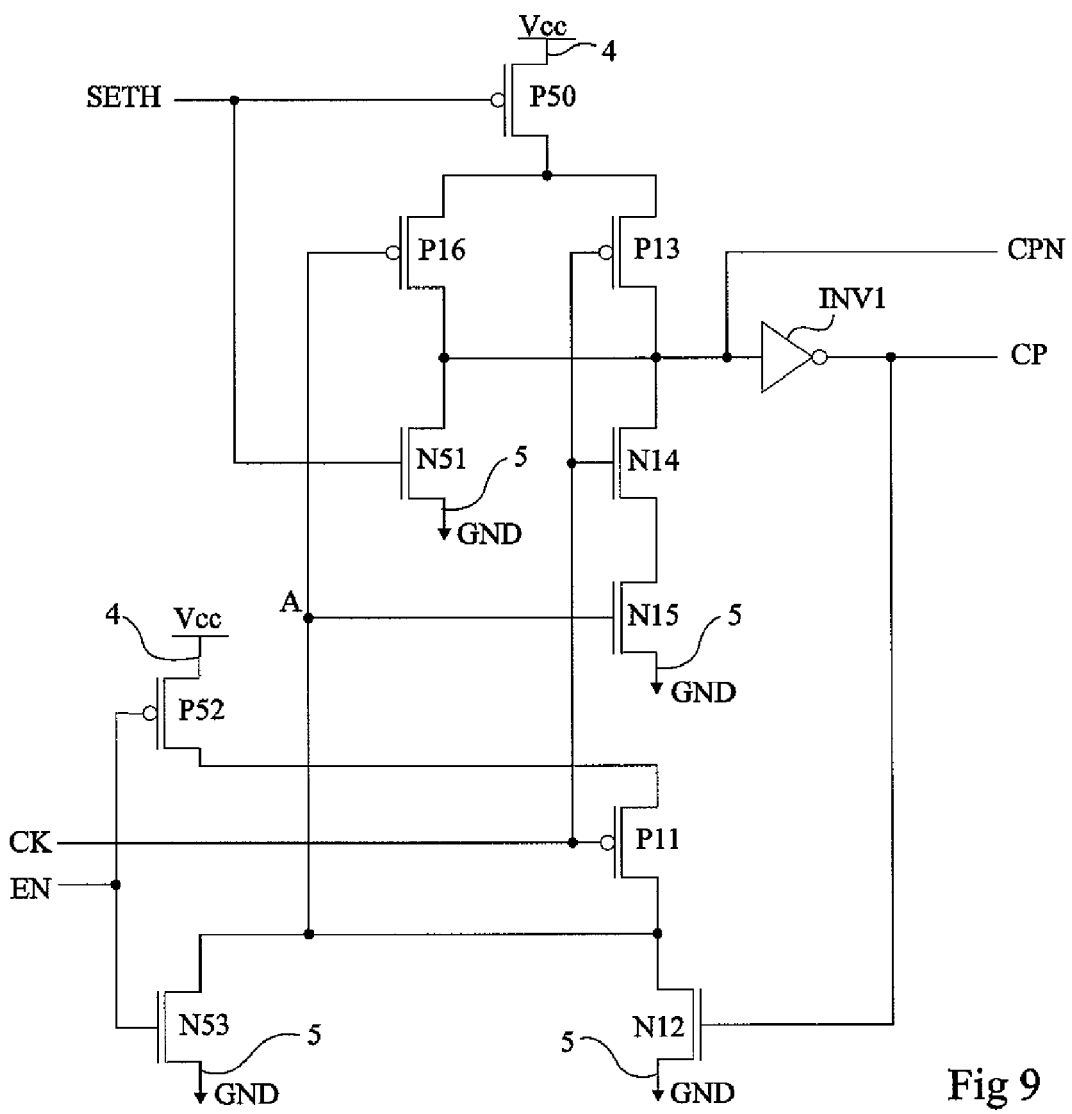
FIG. 9 shows an embodiment of another pulse generator according to the first aspect.

FIG. 9 shows a variation of the pulse generator of FIG. 6B. A third input EN is intended to receive a signal enabling blocking the state of the output of the register(s) synchronized on the signal of output CP, independently from the signal on input CK. Input EN is connected to the gates of a P-type MOS transistor P52 connected between terminal 4 and transistor P11 and of an N-type MOS transistor N53 connected in parallel on transistor N12.

When signal EN is low, transistor P52 is on and transistor N53 is off. Thus, the pulse generator operates in the same way as that of FIGS. 6A and 6B. When signal EN is in the high state, transistor P52 is off, which inhibits the operation of transistor P11. Since transistor N53 is on, transistor P16 is forced to the on state. In the normal case where input signal SETH is low, output CPN is thus connected to terminal 4, and output CP is low.

The output of the pulse generator is thus forced to the low state when input EN is high. This enables avoiding switchings of the output states of the registers synchronized by the pulse generator (switch 21, FIGS. 3 and 4, off).

Third input EN is used, for example, in the case where, at certain periods, registers synchronized by a same pulse generator do not take part in the circuit operation. In this case, the sending of an adapted signal onto input EN of this generator enables blocking the output states of these registers, which avoids unnecessary switchings and decreases the consumption.

Figure 10:
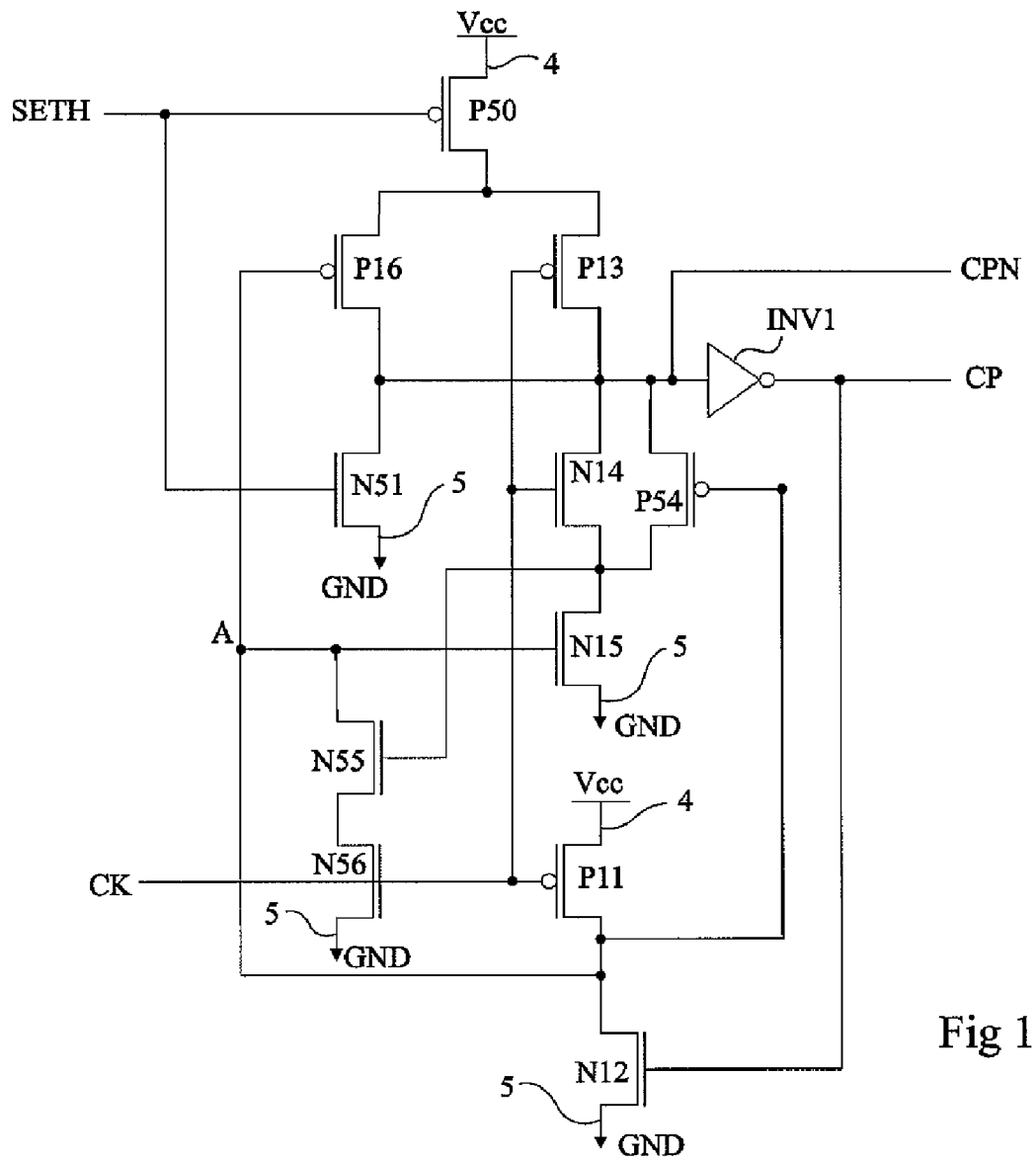
FIG. 10 shows an embodiment of a pulse generator according to another aspect.

FIG. 10 illustrates a pulse generator according to the second aspect. This pulse generator uses the elements of the pulse generator of FIG. 6B. It further comprises three MOS transistors, P54, N55, and N56. Transistor P54 is of type P, its gate is connected to node A and it is connected in parallel on transistor N14. Transistors N55 and N56 are of type N and they are series-connected between node A and terminal 5 (GND). The gate of transistor N55 is connected to the junction point of transistors N14 and N15 and the gate of transistor N56 is connected to input CK.

Figure 11A:
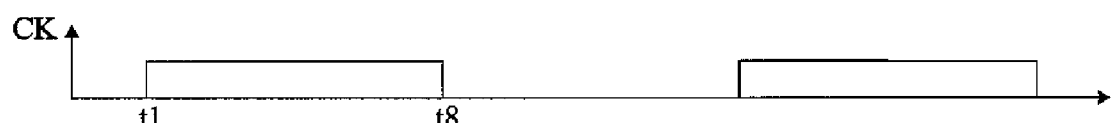
FIGS. 11A and 11B are timing diagrams illustrating the operation of the pulse generator of FIG. 10.
Figure 11B:
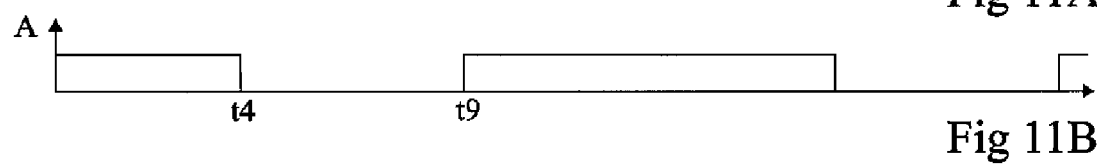

FIGS. 11A and 11B are timing diagrams illustrating the operation of the generator of FIG. 10. FIG. 11A illustrates the state of input CK and FIG. 11B illustrates the corresponding voltage at node A. The times referenced in these timing diagrams correspond to those of FIGS. 2A to 2J.

It has been previously seen that, when the circuit of FIGS. 6A and 6B operates normally, that is, input SETH is in the low state, node A is in a high-impedance state between times t7 and t9 (see FIG. 2D). The three additional transistors P54, N55, and N56 enable setting the voltage of node A to the low state for this time interval. This avoids the forming of parasitic pulses on output CP which would be caused by the leakage currents of transistors N15, P16, and P11. This advantage is obtained by only slightly increasing the pulse generator complexity (three additional transistors).

The high impedance state of node A between times t2 and t4 is less risky since this interval is in practice shorter than that between times t7 and t9. The gate capacitances of transistors N15 and P16 and the drain-source capacitance of transistor N12 are thus sufficient to avoid parasitic switchings. Indeed, the time interval between t2 and t4 depends on the crossing time of logic gates. As for the time interval between t7 and t9, it depends on the time for which the clock signal remains high. In some cases of operation where the clock is stopped, during the test or according to circuits, the ratio between the two time intervals may be on the order of 1,000 or more (for example, 0.1 ns with respect to 100 ns).

Different embodiments have been described. Different variations and modifications will occur to those skilled in the art. In particular, the variations of FIGS. 9 (addition of input EN and of transistors P52 and N53) and 10 (addition of transistors P54, N55, and N56) may be applied to a pulse generator of the type of FIGS. 1A and 1B. Further, a pulse generator comprising the elements of both the variations of FIGS. 9 and 10 may be provided, that is, a pulse generator where the generation of a single pulse per clock cycle is ensured, this pulse generator comprising an input for forcing output CP to the high state (SETH) and an input for forcing output CP to the low state (EN). Further, although the present invention has been described in relation with a positive supply voltage Vcc, it easily transposes to a negative supply voltage, where the levels (high-low) must be relatively interpreted with respect to each other. Finally, transposing the present invention to transistors of inverse type (replacing P MOS transistors with N MOS transistors and conversely) is possible by adapting the supply levels and the input signals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising a generator of synchronization pulses and at least two registers, the pulse generator comprising:
   a first input configured to receive a clock signal and at least one output configured to deliver the synchronization pulses to clock inputs of said registers;
   at least one second input configured to receive a first signal for forcing the at least one output, independently from the clock signal, to make said registers transparent; and
   a third input configured to receive a second signal for forcing the at least one output, independently from the clock signal, to block output states of said registers.

2. The integrated circuit of claim 1, wherein the pulse generator comprises:
   a first P-type MOS transistor and a second N-type MOS transistor, these transistors being series-connected between two terminals of application of a D.C. supply voltage, a gate of the first transistor being connected to the first input of the pulse generator and a gate of the second transistor being connected to the at least one output of the pulse generator;
   a two-input NAND gate having one input connected to the first input of the pulse generator and having its other input connected to a junction point of the first and second transistors;
   a third P-type MOS transistor having its gate connected to the at least one second input of the pulse generator, the third transistor being connected between a first one of the two terminals of application of the D.C. supply voltage and a supply terminal of the NAND gate;
   a fourth N-type MOS transistor having its gate connected to the at least one second input of the pulse generator, the fourth transistor being connected between an output of the NAND gate and a second one of the two terminals of application of the D.C. supply voltage; and
   an inverter connected between the output of the NAND gate and the at least one output of the pulse generator.

3. The integrated circuit of claim 2, wherein the NAND gate comprises:
   a fifth P-type MOS transistor, a sixth N-type MOS transistor and a seventh N-type MOS transistor series-connected between the third transistor and the second terminal of application of the D.C. supply voltage, the gates of the fifth and sixth transistors being connected to the first input of the pulse generator, the gate of the seventh transistor being connected to the junction point of the first and second transistors, a junction point of the fifth and sixth transistors being connected to an input of the inverter; and an eighth P-type MOS transistor, connected in parallel with the fifth transistor, having a gate of the eighth transistor connected to the junction point of the first and second transistors.

4. The integrated circuit of claim 2, wherein the pulse generator further comprises:
a fifth P-type MOS transistor, connected between the first terminal of application of the D.C. supply voltage and the first transistor, having a gate of the fifth transistor connected to the third input of the pulse generator; and
a sixth N-type MOS transistor, connected between the junction point of the first and second transistors and the second terminal of application of the D.C. supply voltage, having a gate of the sixth transistor connected to the third input of the pulse generator.

5. The integrated circuit of claim 3, wherein the pulse generator further comprises:
ninth P-type MOS transistor, connected in parallel with the sixth transistor, having a gate of the ninth transistor connected to the junction point of the first and second transistors; and
a tenth and an eleventh N-type MOS transistor, series-connected between the junction point of the first and second transistors and the second terminal of application of the D.C. supply voltage, a gate of the tenth transistor being connected to a junction point of the sixth and seventh transistors, a gate of the eleventh transistor being connected to the first input of the pulse generator.

6. The integrated circuit of claim 1, wherein
the at least two registers comprise a set of registers having respective clock inputs connected to the output of a pulse generator, the registers of the set of registers configured to receive a forcing signal to force respective outputs of the registers to a state.

7. The integrated circuit of claim 6, wherein at least some of the registers of the set of registers receive pulses originating from two different pulse generators according to one of two operating modes, a first of the two operating modes being a normal operating mode and a second of the two operating modes being a testing operating mode in which the outputs of that at least some of the registers are to be forced.

8. A method for carrying out a functional test of an integrated synchronization circuit comprising at least one pulse generator connected to at least one register, the method comprising:
forcing, with the at least one pulse generator, the at least one register to a transparent operating state, wherein an output of the at least one pulse generator is connected to at least one clock input of the at least one register, and the at least one pulse generator comprises:
a first input configured to receive a clock signal and at least one output configured to deliver synchronization pulses to clock inputs of the at least one register;
at least one second input configured to receive a first signal for forcing the at least one output, independently from the clock signal, to make the at least one register transparent; and
a third input configured to receive a second signal for forcing the at least one output, independently from the clock signal, to block output states of the at least one register.

9. An integrated circuit for generating synchronization pulses comprising:
a first input configured to receive a clock signal and at least one output configured to deliver the synchronization pulses to clock inputs of at least one register;
at least one second input configured to receive a first signal for forcing the at least one output, independently from the received clock signal, to a value to make the at least one register transparent; and
a third input configured to receive a second signal for forcing the at least one output, independently from the received clock signal, to a value to block output states of the at least one register.

10. The integrated circuit of claim 9, wherein the at least one register comprise a set of registers having respective clock inputs connected to the at least one output of the pulse generator, the registers of the set of registers configured to receive a forcing signal to force the set of registers to a transparent state or a blocked state.

11. An integrated circuit for generating synchronization pulses comprising:
a first P-type MOS transistor and a second N-type MOS transistor, these transistors being series-connected between two terminals of application of a D.C. supply voltage, the first transistor connected to a first one of the two terminals and the second transistor connected to a second one of the two terminals, a gate of the first transistor being connected to a first input of the integrated circuit and a gate of the second transistor being connected to at least one output of the integrated circuit;
a two-input NAND gate having one input connected to the first input and having its other input connected to a junction point of the first and second transistors;
a third P-type MOS transistor having its gate connected to at least one second input of the integrated circuit, the third transistor being connected between a first one of the two terminals of application of the D.C. supply voltage and a supply terminal of the NAND gate;
a fourth N-type MOS transistor having its gate connected to the at least one second input of the integrated circuit, the fourth transistor being connected between an output of the NAND gate and a second one of the two terminals of application of the D.C. supply voltage; and
an inverter connected between the output of the NAND gate and the at least one output of the integrated circuit.

12. The integrated circuit of claim 11, further comprising:
a fifth P-type MOS transistor, connected between the first terminal of application of the D.C. supply voltage and the first transistor, having a gate of the fifth transistor connected to the third input of the integrated circuit; and
a sixth N-type MOS transistor, connected between the junction point of the first and second transistors and the second terminal of application of the D.C. supply voltage, having a gate of the sixth transistor connected to the third input of the integrated circuit.

* * * * *